US008629600B2

(12) United States Patent
Symko et al.

(10) Patent No.: US 8,629,600 B2
(45) Date of Patent: Jan. 14, 2014

(54) ANNULAR THERMOACOUSTIC ENERGY CONVERTER

(75) Inventors: Orest G. Symko, Salt Lake City, UT (US); Ivan A. Rodriguez, Salt Lake City, UT (US); Ryan Behunin, Salt Lake City, UT (US); Marie Urry, Centerville, UT (US)

(73) Assignee: University of Utah Research Foundation, Salt Lake City, UT (US)

( * ) Notice: Subject to any disclaimer, the term of this patent is extended or adjusted under 35 U.S.C. 154(b) by 917 days.

(21) Appl. No.: 12/777,095

(22) Filed: May 10, 2010

(65) Prior Publication Data

US 2013/0320804 A1 Dec. 5, 2013

Related U.S. Application Data

(60) Provisional application No. 61/176,825, filed on May 8, 2009, provisional application No. 61/180,367, filed on May 21, 2009.

(51) Int. Cl.
*H01L 41/113* (2006.01)
(52) U.S. Cl.
CPC .................................. *H01L 41/113* (2013.01)
USPC ......................................................... 310/339
(58) Field of Classification Search
CPC .............. F25B 9/10; F25B 9/14; F25B 9/145; H01L 41/113; H01L 41/1132; H01L 41/1134; H01L 41/1136; H01L 41/1138
USPC ......................................................... 310/339
See application file for complete search history.

(56) References Cited

U.S. PATENT DOCUMENTS

| 6,385,972 | B1 | 5/2002 | Fellows |
| 6,591,610 | B2 | 7/2003 | Yazawa et al. |
| 7,240,495 | B2 | 7/2007 | Symko et al. |
| 2002/0194897 | A1 | 12/2002 | Arnott et al. |
| 2008/0060364 | A1* | 3/2008 | Watanabe et al. ................... 62/6 |
| 2009/0096322 | A1 | 4/2009 | Peacock |

OTHER PUBLICATIONS

PCT/US 10/01384, International Search Report and Written Opinion, dated Feb. 4, 2011, (9 pages).
Science Daily, "A Sound Way to Turn Heat Into Electricity" [online]. Published in The Science Daily, Jun. 4, 2007. Retrieved on Jan. 16, 2011 from the Internet at URL: http://www.sciencedaily.com/releases/2007/06/070603225026.htm, (12 pages).
The Next Big Future. "Small 40% efficient heat—sound—electricity converter" [online]. Posted by BW on The Next Big Future, Jun. 6, 2007. Retrieved on Jan. 16, 2011 from the Internet at URL:<http://nextbigfuture.com/2007/06/small-40-efficient-heat-sound.html>, (3 pages).

* cited by examiner

*Primary Examiner* — Derek Rosenau
(74) *Attorney, Agent, or Firm* — Michael Best & Friedrich LLP

(57) ABSTRACT

A thermoacoustic energy converter for converting heat energy to electricity includes an annular resonator with a regenerator disposed therein. An electro-mechanical transducer is coupled to the annular resonator and in fluid communication with the working fluid. When heat is applied to one end of the annular resonator, a traveling acoustic wave is generated in the annular resonator causing vibrations in the working fluid that actuate the electro-mechanical transducer to generate electricity.

14 Claims, 9 Drawing Sheets

ANNULAR THERMOACOUSTIC ENERGY CONVERTER

CROSS-REFERENCE TO RELATED APPLICATIONS

This invention claims priority to U.S. Patent Application Ser. Nos. 61/176,825 filed May 8, 2009 and 61/180,367 filed on May 21, 2009, the entirety of each of which is incorporated by this reference.

GOVERNMENT RIGHTS

This invention was made with government support under N0001403-1-1-0543 awarded by the Office of Naval Research and W9113M-05-C-0195 awarded by the U.S. Army Space and Missile Defense Command/U.S. Army Forces Strategic Command. The Government has certain rights to this invention.

TECHNICAL FIELD

The present invention relates generally to systems and methods for the generation of electricity in the conversion of heat to sound in a resonator. More particularly, the present invention relates to systems and methods for directly generating electricity in the conversion of heat to sound in a miniaturized device which is compact light, and capable of handling high power densities.

BACKGROUND

The concept of converting heat to sound has been known for over two hundred years. For example, in the "singing pipe," heat is applied to a closed end of a resonant tube having a metal mesh within the tube which has a "hot" end near the heated end of the resonant tube and a "cold" end further from the heat source. The terms "hot" and "cold" refer to their relative temperatures with respect to each other. The "hot" end could be at room temperature with the important parameter not being the actual temperature, but the temperature gradient.

An acoustical standing wave set up in the resonator tube forces a working fluid (e.g., a gas) within the resonator to undergo a cycle of compression, heating, expansion, and cooling. In this case, thermal energy is converted into acoustical energy and it maintains the standing waves.

The work of converting heat to sound has been moved forward through the development of thermoacoustical refrigerators, as disclosed in U.S. Pat. No. 6,574,968, entitled HIGH FREQUENCY THERMOACOUSTIC REFRIGERATOR, which is incorporated herein by reference. Essentially, the conversion of heat to electricity by the present invention can be thought of as the opposite process performed by the thermoacoustic refrigerator. Thus, instead of applying energy to a piezoelectric element to thereby cool a device, energy is being taken and converted from a heat source itself.

Early attempts to create a thermoacoustic energy converter have failed for various reasons. For example, the process was performed in prior art devices operating at around 100 Hz which would convert the low frequency sound to electricity. However, the process was abandoned by those skilled in the art because of the very low efficiency of the energy conversion process at low frequencies.

One prior art process for direct conversion of heat to electricity utilizes a permanent magnet and a moving coil. This process is costly because of the magnet. It is also bulky and heavy and the efficiency decreases as the frequency of the device increases, making high frequency operation impractical. The device itself can also cause magnetic interference with nearby magnetically sensitive devices, precluding use in certain environments.

In order to make a thermoacoustic energy conversion process practical, it may be desirable to operate the device at high frequencies. High frequencies can result in more efficient operation of an electro-mechanical transducer, such as a piezoelectric element that is to be used in the present invention for the conversion of sound energy to electricity.

Another advantage of operation at high frequencies comes from a comparison with prior art thermoacoustic devices that are relatively large compared to semiconductor devices and biological samples. Thus, it would be another advantage to make the thermoacoustic energy converter small enough to be operable with such devices and samples.

Attempts to address the shortcomings of the prior art have resulted in devices, such as that disclosed in the published International Patent Application entitled High Frequency Thermoacoustic Energy Converter, International Publication Number WO 03/049491, which is incorporated by reference herein in its entirety. Such devices addressed the problems with other prior art devices by using a resonator that also functions as a housing for an electro-mechanical transducer, a regenerator formed from random fibers comprised of a material having poor thermal conductivity and a pair of heat exchangers comprised of a material having good thermal conductivity positioned on opposite sides of the regenerator. The energy converter utilizes a standing wave within each resonator, which limits the efficiency of the device.

Another attempt is disclosed in the published U.S. patent application entitled Compact Thermoacoustic Array Energy Converter, U.S. Publication. Number 20090184604A1, which is incorporate by reference herein in its entirety. In this application, a plurality of heat driven thermoacoustic prime movers are arranged in parallel, coupled by means of an acoustic cavity to a piezoelectric electrical generator whose output is rectified and fed to an energy storage element. The prime movers convert heat to sound in a resonator. The sound form a phase-locked array is converted to electricity by means of the piezoelectric element. The generated electric energy is converted to DC by means of a rectifier set and it is then stored in a battery or supercapacitor. Again, this type of device generates a standing wave within the resonator, which limits efficiency.

In 1979, P. Ceperley introduced the concept of a traveling wave thermoacoustic device for improved efficiency. This is in contrast to the standing wave device where a phase shift is needed to provide power output. It is achieved by heat flow between a regenerator of high surface area elements and the generated sound field, which introduces irreversibilities. In a traveling wave device there is no need for a phase shift between acoustic pressure and acoustic speed, and hence a high efficiency is expected. Ceperley found that acoustical energy could be generated by differentially heating a regenerator within a wave guide. Because of such heating, the gas in the regenerator region undergoes a Stirling thermodynamic cycle similar to a Stirling cycle where air acts like a piston. Ceperley also found that if the acoustic wave propagates from cold to hot inside the regenerator acoustic amplification occurs; i.e. the heat gradient is driving the wave and it amplifies the acoustic power. Such a device is a thermoacoustic prime mover. The regenerator replaces the stack in the standing wave device; its function is to exchange heat with the sound wave, isothermally, i.e. with $\omega\tau \ll \pi$ where $\omega$ is the angular frequency of the sound wave and $\tau$ is the thermal relaxation time between regenerator and sound field. Ceperley also calculated the ideal gain and energy conversion for these devices. This work stimulated much research, experimentally and theoretically, as well as numerical investigations.

Prior developments have shown the performance of a looped tube traveling wave engine. It had an average length of 2.58 m and the frequency of the gas oscillations was 268 Hz3. Further development of this type of engine by the Los Alamos group led to a device which included a resonator. Their device was 5.00 m long and it operated with helium gas at 30 atm. Its resonant frequency was 80 Hz. The experimental results demonstrated up to 50% more efficiency than its standing wave counterpart, reaching efficiencies of 41% of Carnot. A limiting factor in efficiency was the problem of streaming which was subsequently suppressed. Due to the low acoustic impedance of the working gas viscous losses were high. This was solved by increasing the gas impedance by adding a standing wave component.

Electronic devices and machinery produce waste heat which limits their performance and efficiency. Thermal management of such heat and its conversion to electrical power would raise their output and at the same time provide an important source of renewable energy. Achieving such goals with simple, efficient and high power density devices would assist in providing a solution to current energy problems. The effectiveness of such an approach will be determined by the nature of the devices, on their ability to cope with a wide range of heat inputs from waste heat, and on their impact on the environment.

Problems that need to be solved deal with device interfacing to the source of waste heat and device scaling to a wide range of heat sources including compact electronics. Moreover with escalating power levels in waste heat, it is important for the devices to be high power density units in order to cope with high power level demands. Thus, there is an ever-increasing need for more energy to be reduced by providing renewable energy from waste heat. As there is an abundance of such waste heat, an efficient technology is needed for converting the waste heat to electricity. Such a technology would be capable of interfacing with sources of waste heat, would have an extended life and would be relatively inexpensive to manufacture and implement. A system or method capable of addressing these issues and of handling the dual function of energy conversion and thermal management for a wide range of applications would be an improvement in the art.

SUMMARY

Accordingly, the present invention provides a significant improvement in the development of miniaturized annular traveling wave thermoacoustic prime movers, operating in the frequency range of a few kilohertz. The dimensions typically found in prior art devices have been scaled down by a substantial factor and hence the devices perform in a new frequency and size regime. By operating with an annular geometry, positive feedback is used to maintain the acoustic oscillations. Further development of this approach leads to the conversion of sound to electricity. The generated sound power is coupled to a piezoelectric device for direct conversion of heat to electricity.

In addition, Particle Image Velocimetry (PIV) studies on the engines developed here show the role played by the geometric factors in the nature of the sound field inside the waveguide. These studies can be used in the design and further development of such devices. The performance and efficiency are analyzed within existing models of this kind of energy conversion units.

A thermoacoustic device includes a compact annular resonant system which converts heat to sound in an annular resonator and which transforms the sound directly to electricity at levels which can be used to power other electrical systems. Heat applied to a hot end of the resonator sets up a traveling sound wave within the resonator which is coupled to a sound-to-electricity converter, such as a piezoelectric monomorph energy converter. The electrical energy at audio or ultrasonic frequencies is rectified for storage through electrical circuitry and components. In order to increase the energy level and thus the production of electricity derived from a heat source, a plurality of thermoacoustic devices may be used. A low onset diode full-wave rectifier set may be employed with the piezoelectric device to provide a DC output for energy storage on a battery or a supercapacitor.

Injected heat generates sound in the annular resonator. The resonator is acoustically coupled to sound-to-electricity converter (i.e., the energy converter). The chamber allows for sustained acoustic oscillations in the resonator with positive feedback. The sound-to-electricity converter is acoustically coupled to the resonator chamber to generate maximum electrical power from heat-generated sound. Such devices, while useful as energy converters, may also provide thermal management in a variety of large and small systems that produce waste heat in operation.

In accordance with one aspect of the present invention, heat from a heat source or waste heat is coupled by a thermal conductor to the hot side of the thermoacoustic device.

In accordance with another aspect of the present invention, an energy converter in the form of a piezoelectric element is used to collect acoustic energy from the annular resonator.

In accordance with yet another aspect of the present invention, a plurality of energy converters are attached to the annular resonator.

In accordance with yet another aspect of the present invention, a plurality annular of resonators is coupled to a heat source for producing electricity.

In accordance with another aspect of the present invention, audio or ultrasonic frequency energy is changed to DC electricity by means of an efficient rectifier and stored in a battery or a supercapacitor.

Methods of utilizing such devices to capture waste heat from electronic devices or machinery are also included in the present invention, as are methods of creating such devices.

DESCRIPTION OF THE DRAWINGS

It will be appreciated by those of ordinary skill in the art that the various drawings are for illustrative purposes only. The nature of the present invention, as well as other embodiments of the present invention, may be more clearly understood by reference to the following detailed description of the invention, to the appended claims, to the appendix attached hereto, and to the several drawings.

DETAILED DESCRIPTION OF THE ILLUSTRATED EMBODIMENTS

The present invention relates to systems and methods related to thermoacoustic devices. It will be appreciated by those skilled in the art that the embodiments herein described, while illustrating certain embodiments, are not intended to so limit the invention or the scope of the appended claims. Those skilled in the art will also understand that various combinations or modifications of the embodiments presented herein can be made without departing from the scope of the invention. All such alternate embodiments are within the scope of the present invention. Similarly, while the drawings depict illustrative embodiments of the devices and components in accordance with the present invention and illustrate the principles upon which the device is based, they are only illustrative and any modification of the invented features presented here are to be considered within the scope of this invention.

In view of the demands for thermal management and for energy conversion from heat to electricity, an efficient and compact unit, based on thermoacoustics is provided. In such a device, where heat produces sound and in the same unit the sound is directly converted to electricity, a resonant acoustic system, regenerator, an acoustic cavity, and an electrical generator are provided.

Figure 1:
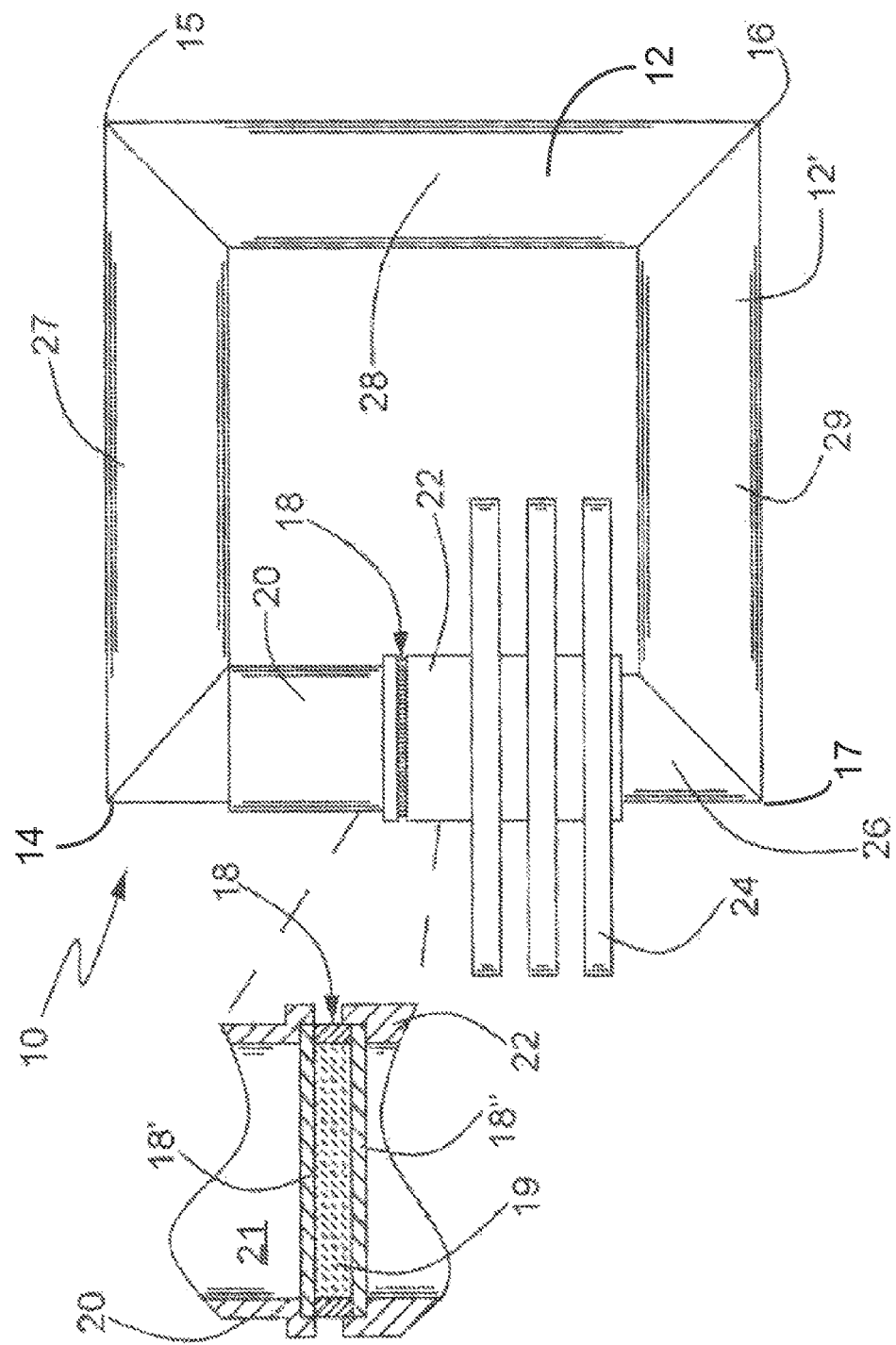
FIG. 1 is a side view of a first embodiment of a thermoacoustic annular device having square corners in accordance with the principles of the present invention

Referring now to FIG. 1, an annular-type, traveling wave, thermoacoustic energy converter ("annular device"), generally indicated at 10 in accordance with the present invention is illustrated. The annular device 10 may be configured for operation in the 2 kHz to 4 kHz range. Likewise, the annular device may be configured to operate in the ultrasonic range (e.g., about 24 kHz and higher). In these frequency ranges, advantage is taken of the high sensitivity of piezoelectric devices and their compactness. An electro-mechanical type of transducer, such as a piezoelectric device, for sound to electricity conversion is superior to an electromagnetic type when operated at high frequencies and when compactness is an issue, as in the miniaturization of devices. Since the thermoacoustic devices are resonant systems, their size determine the resonant frequency, and hence by miniaturizing them, the operating frequency is raised accordingly. The choice of device size is determined by the application and by how much power needs to be converted. Units consisting of arrays offer the possibility of dealing with large power levels which maintain compactness and offer lightweight systems.

Performance of the system of the present invention is determined by operating conditions, mainly the temperature difference imposed by the source of heat driving the system. The amount of heat and the resulting temperature difference will determine the power output, its efficiency and onset for oscillation. The larger the heat input, the higher the sound level will be in the resonator resulting in greater electrical generation. This allows for miniaturization of the annular device 10 for various applications and to extend the scope of operation of thermoacoustics. The annular device 10 is comprised of a generally square-shaped annular resonator 12 having a circular cross-section (effectively forming an annular tube) having relatively square corners 14-17 and defining a resonator chamber 21 therein. Of course, other annular shapes are contemplated herein including, but not limited to, circular, oval, rectangular, hexagonal or other geometric shapes. The regenerator 18 is comprised of material in random form, such as random fibers of material. A hot heat exchanger 20 and cold heat exchanger 22 are positioned on opposite sides of the regenerator 18. The regenerator 18 includes a hot heat exchanger 18' and a cold heat exchanger 18" and a regenerator material 19 disposed between and in thermal contact with each heat exchanger 18' and 18". The regenerator material 19 may comprise cotton wool, glass wool, steel wool, aerogel, other fibrous materials, a series of perforated plastic plates or a plurality of longitudinally aligned nanotubes. The optimum spacing between the randomly arranged fibers in the regenerator material 19, when a fibrous regenerator material 19 is utilized, may be determined by the thermal penetration depth for the working fluid or gas, such that the acoustic field can interact thermally with each element of the regenerator material 19. The regenerator 18 is positioned within the resonator 12. The hot heat exchanger 18' is thermally coupled to the hot end 20 of the resonator 12 and thermally isolated from the cold heat exchanger 18" and cold end 22. The resonator 12 may thus be formed of a non-thermally conductive material to reduce thermal conduction along the annular body of the resonator from the hot side 20 to the cold side 22. The cold heat exchanger 18" is thermally anchored to a fixed temperature, e.g., ambient temperature. Both heat exchangers 18' and 18" may be formed as a thin screen which is effectively acoustically transparent, but that maintains a fixed temperature at each end of the regenerator material 19. The heat exchangers 18' and 18" may be formed from laser patterned copper or aluminum. The working fluid is disposed within the resonator 12, which also functions as the resonator or acoustic chamber 21. In operation, a temperature gradient is formed across the regenerator material 19. The resulting temperature gradient across the regenerator material 19 creates a traveling n acoustic wave within the resonator 12. The working fluid, such as air, helium, argon, combinations thereof or other known gases is disposed within the resonator 12. The working fluid allows the traveling wave to form and to activate the electro-mechanical transducer. Thus, when heat is applied to the first end, a traveling acoustic wave is generated in the annular resonator causing vibrations in the working fluid that actuate the electro-mechanical transducer to generate electricity.

A finned heat sink 24 is coupled to the cold heat exchanger to help dissipate heat and thus cool the cold heat exchanger 22. The finned heat sink 24 may be comprised of copper, or other thermally conductive material, cooling fins attached to the cold heat exchanger 22 having a surface area of approximately 64.6 cm$^2$ for a 2 kHz device and approximately 31.2 cm$^2$ for others. Such cooling fins may be sufficient for relatively short time applications, but more efficient heat dissipation at the cold end may be needed for longer operating times. The resonator 12 is comprised of an annular waveguide 12' that forms a hollow ring-like structure between the hot heat exchanger 20 and the cold heat exchanger 22. The annular waveguide 12' is filled with a working gas, such as air at atmospheric pressure (e.g., 1 atmosphere pressure). The length of the annular device 10 may have an overall length, when combining the length of each of the sides 26-29 of approximately 8.57 cm to 17 cm, depending on the operating frequency.

Figure 2:
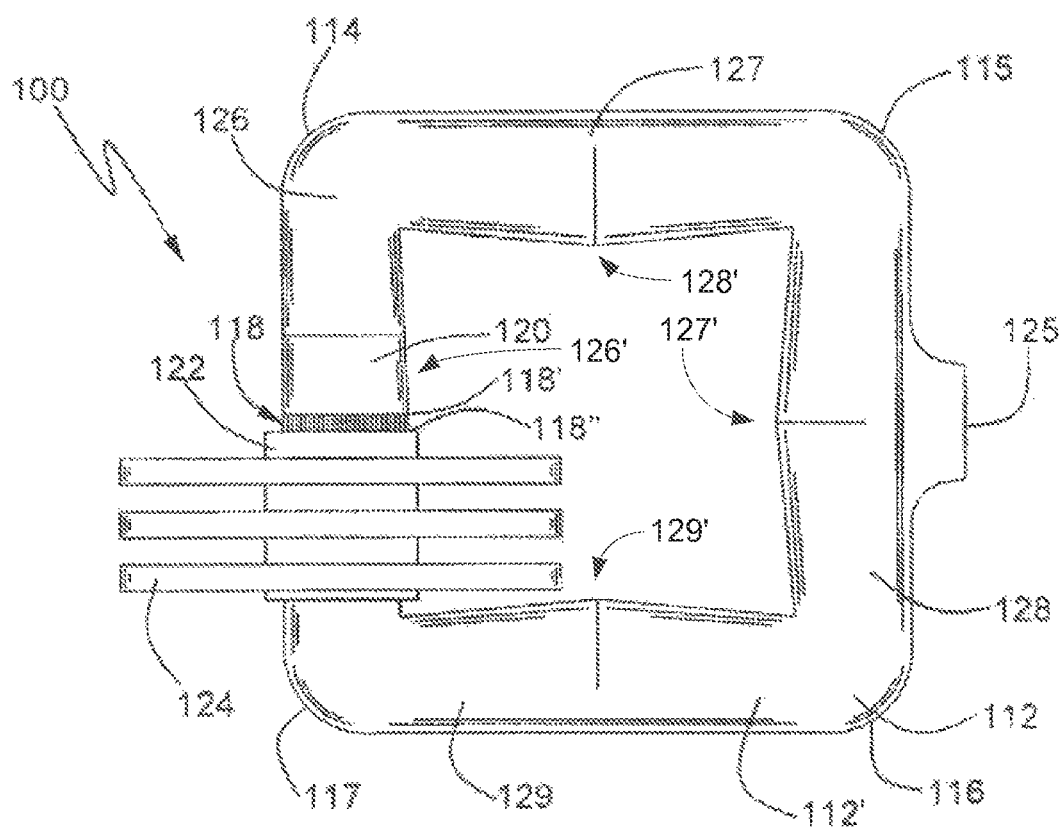
FIG. 2 is a side view of a second embodiment of a thermoacoustic annular device having rounded corners in accordance with the principles of the present invention.

Similarly as shown in FIG. 2, an annular-type, traveling wave, thermoacoustic prime mover device ("annular device"), generally indicated at 100 in accordance with the present invention is illustrated. The annular device 100 is configured for operation in the 2 kHz to 4 kHz range. This allows for miniaturization of the annular device 100 for various applications and to extend the scope of operation of thermoacoustics. The annular device 100 is comprised of a generally square-shaped annular resonator 112, but is provided with rounded corners 114-117. In addition, each side 126-129 of the resonator 112 is provided with an enlarged midsection 126' to 129' respectively, where the diameter of each side 126-129 is increased to enhance resonance of sound within the resonator 112. The regenerator 118 is comprised of material in random form, such as random fibers of material. A hot heat exchanger 120 and cold heat exchanger 122 are positioned on opposite sides of the regenerator 118. A finned heat sink 124 is coupled to the cold heat exchanger to help dissipate heat and thus cool the cold heat exchanger 122. The resonator 112 is comprised of an annular waveguide 112' that forms a hollow ring-like structure between the hot heat exchanger 120 and the cold heat exchanger 122. Opposite the regenerator 118 is an energy converter connection port 125 for connecting an energy converter, such as a piezoelectric element, thereto. The port 125 is comprised of an opening in a side wall of the annular resonator 12 and is positioned approximately at the midpoint of the annular resonator 112, that is, approximately midway between the hot heat exchanger 118' and the cold heat exchanger 118". The annular waveguide 112' is filled with a working gas, such as air at atmospheric pressure (e.g., 1 atmosphere pressure). The length of the annular device 100 may have an overall length, when combining the length of each of the sides 126-129 of approximately 8.57 cm to 17 cm, depending on the operating frequency.

Figure 3:
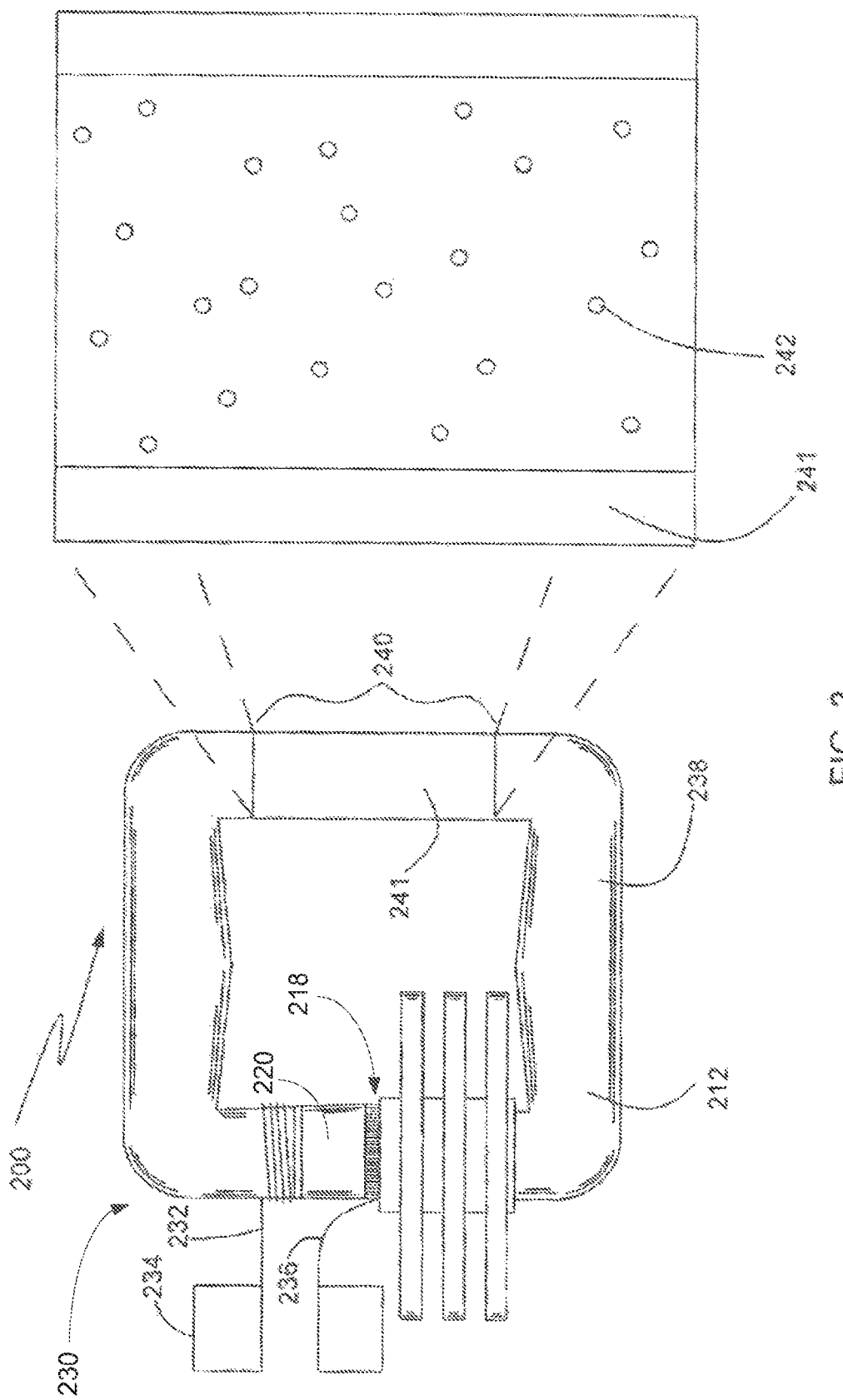
FIG. 3 is a side view of a third embodiment of a thermoacoustic annular device modified for Particle Image Velocimetry measurements according to the principles of the present invention with an expanded view of a glass tube portion of the device according to the principles of the present invention.

Referring now to FIG. 3, in order to operate the annular device 100, heat is injected to a hot end 230 of the device 200 by means of a resistance wire heater 232 wound directly on the annular device 212 proximate to the hot heat exchanger 220. Of course, in practice the annular device 200 would be coupled to a heat source, such as electronic component, machine or other device that produces heat when operating, in such a manner as to transfer the heat from the heat source to the hot side 230 of the annular device 200. Once a threshold temperature gradient is reached along the regenerator 218, the device 200 emits a loud sound. The frequency of the generated sound scales with the average length of the annular device.

In providing a thermoacoustic energy converter where heat is converted to sound, which in turn produces electricity via an electro-mechanical transducer, such as a piezoelectric transducer, the regenerator 218 maintains the heat transfer process between it and the sound field at angular frequency was isothermal as possible, i.e. to maintain the condition $\omega\tau<<\pi$. Since the thermal relaxation time $\tau$ is equal to $r^2/2\kappa$ where r is an effective distance between elements of the regenerator and $\kappa$ is the thermal diffusivity of the working gas), the isothermal condition will be satisfied when the heat elements of the regenerator are close to each other. This leads to spacing between elements, which is less than $\delta_K$, the thermal penetration depth. $\delta K$ is equal to $(2\kappa/\omega)^{1/2}$ where $\kappa$ is the thermal diffusivity. In this approach, the spacing between elements should not contribute significantly to the flow resistance. The regenerator filling factor by volume may be approximately fifteen percent (15%) and be comprised of randomly arranged fibers of steel wool. The device can be operated at $\omega\tau<<\pi$ or where $\omega\tau$ equals approximately 0.3.

Heat is injected on the hot side 230 at the hot heat exchanger 220 by, for example, an attached heater 232 which was activated by a power supply 234. Sound levels are monitored by a piezoresistive probe 236 located inside the waveguide 238. For the PIV measurements, one section 240 of the annular waveguide 238 is comprised of a transparent lucent tube, such as a PYREX® glass tube, formed from a transparent material such as glass, so that a laser beam can pass through the section 240 to be scattered by seed particles in the sound field thus providing an image of the sound field. The particles 242 may be comprised of fine smoke which is injected into the device 200 before the measurements of particle velocity in the sound stream are taken. The tube 241 is located opposite the regenerator 218, and positioned approximately halfway along the waveguide 238 between the ends of the waveguide 238 adjacent the regenerator 218.

The annular device 200 according to the present invention is configured for operating at approximately 2 kHz to produce a voltage over time. To produce a voltage, the annular device 200 is configured to convert some of the sound energy to electricity using a piezoelectric element. As further illustrated and described herein, a relatively small tube is attached to the waveguide and is coupled a piezoelectric device, such as a monomorph piezoelectric device. Dimensions of the tube may be adjusted for optimal impedance matching and to moderate loading of the acoustic device. The tube and piezoelectric device effectively provides a load on the annular device.

The lowest onset temperature difference for oscillation for a 2 kHz square annular engine was $\Delta T=60°$ C. when T $C_c=55°$ C. and $T_h=115°$ C. The generated sound wave is monitored internally by a piezoresistive probe, such as a Honeywell XCA401 DN. Some of the sound emanating from the device may be audible. For a device having a waveguide length of approximately 17 cm, the resonant frequency may be approximately 1.952 kHz with a generated sound intensity of 0.80 W/cm$^2$. Harmonic distortion is relatively low, e.g., less than about 1%.

Figure 4:
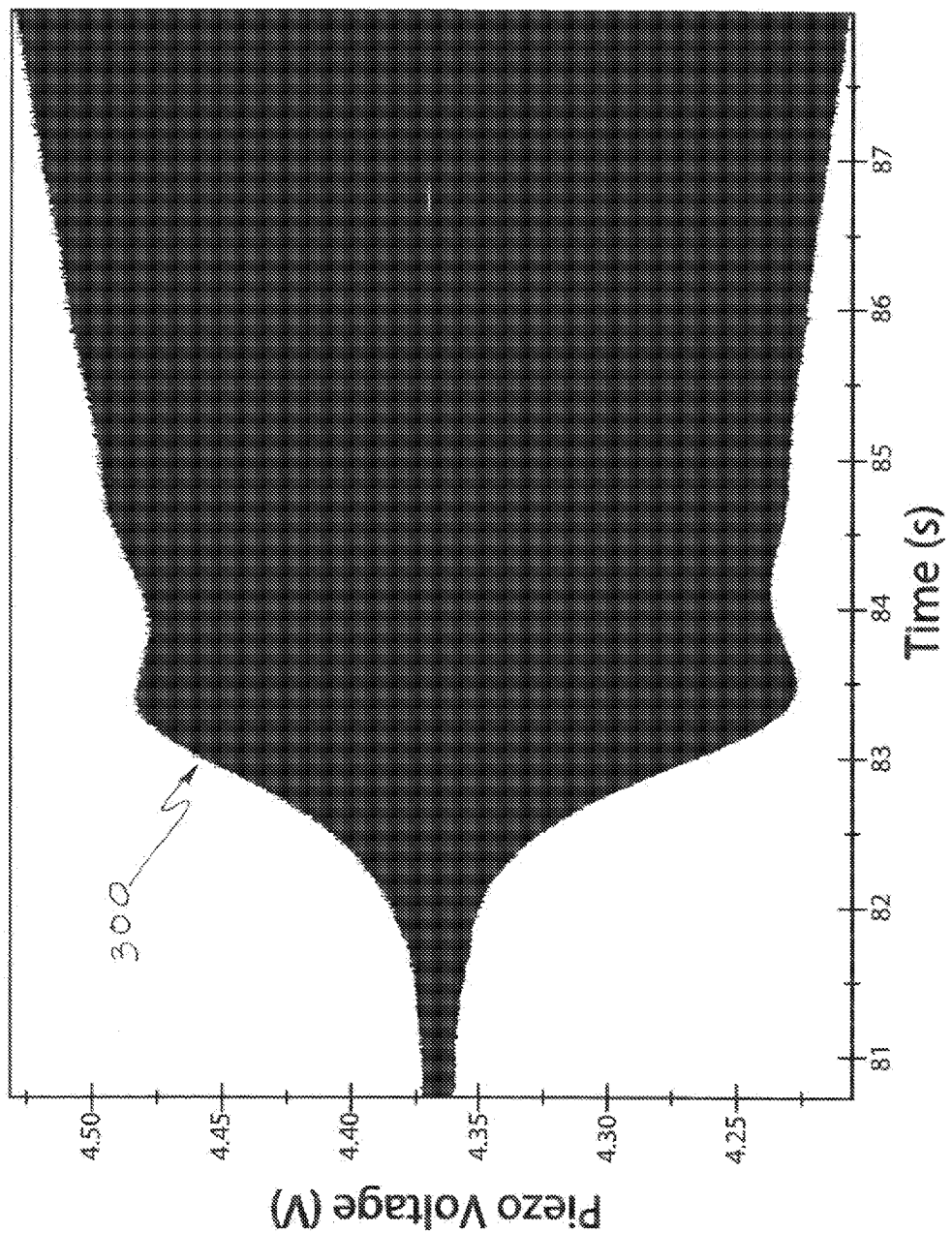
FIG. 4 is a graph illustrating an onset waveform of a 2 kHz annular device according to the principles of the present invention.

Referring now to FIG. 4, a sound wave, generally indicated at 300, generated at onset as a function of time for a constant heat input, is illustrated. The sound wave 300 has the characteristics initial exponential rise in amplitude followed by saturation. After the waveform is initiated at threshold, a surge of the signal is followed by a leveling off. A possible explanation of this is a rapid acoustic radiation of excess heat followed by an adjustment to an equilibrium situation. The level of sound intensity varies with heat input.

The annular devices according to the present invention may be configured to and optimized to operate at various frequencies. For example, annular devices may be configured to operate at 4 kHz or more. For such a device, the circumferential average length L may be approximately 8.6 cm. Such devices operate effectively above a threshold temperature difference along the regenerator. The oscillations can be maintained for long periods of time (e.g., more than 30 minutes). One limiting factor may be a slow increase with time of the temperature of the cold heat exchanger due to heat influx from the hot side. Such an influx can be remedied by using more efficient cooling fins or other types of heat sinks.

An important feature of the annular device of the present invention involves the generation of a traveling wave during operation of the device. On resonance, one would expect that the circumference of the annular device is equal to $n\lambda$ (where n is 1 in and $\lambda$ is the wavelength of the generated sound), and the sound produced by the regenerator would correspond to a traveling wave in the waveguide. The impedance discontinuity at the regenerator and air interface and possibly the temperature gradient at the regenerator could promote a standing wave component. The resonant frequency of each device corresponds to a frequency for which the circumference is equal to the wavelength $\lambda$ of the sound with n=1.

As study of the effect of the regenerator on device performance was performed so as to determine the absorption of acoustic waves. For sound generated by a piezoelectric driver, and having a steel wool regenerator of approximately 0.5 mm thick located between heat exchangers at each end thereof, an average acoustic absorption of 47.8% was measured at 2.55 kHz. Further tests showed that the regenerator assembly produced no reflection of the sound wave in the resonator tube and hence no standing waves were observed; only absorption was observed. The possibility of causing reflected sound intensity by the regenerator with a temperature difference along it was investigated in the impedance tube. For temperature differences $\Delta T$ up to 130° C., reflected intensity off the regenerator was not observable. These experiments on the regenerator provide an indication of the nature of the generated sound and the relative amount of the traveling wave component in the waveguide.

Figure 5:
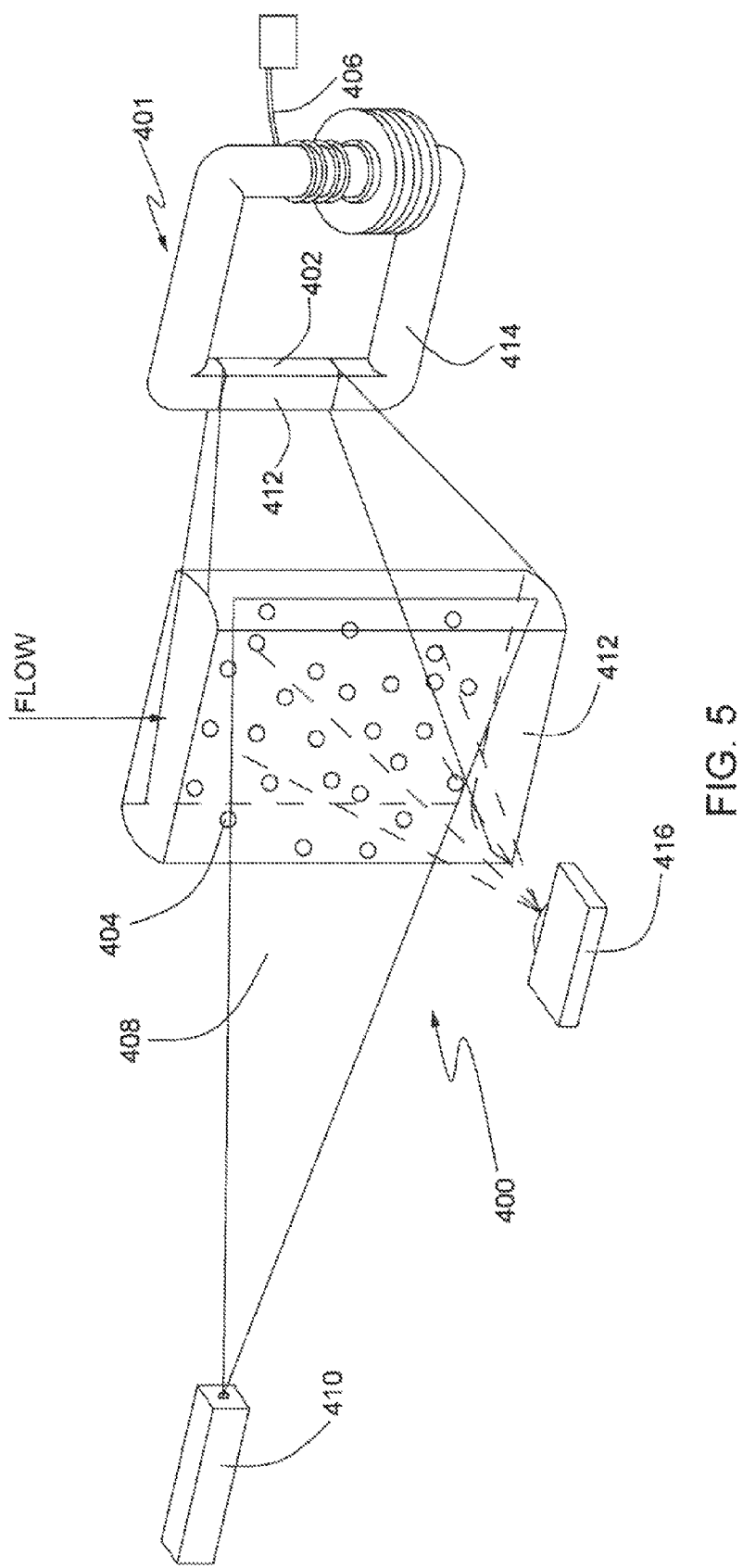
FIG. 5 is a perspective side view of an experimental particle Image Velocimetry experimental setup according to the principles of the present invention.

Referring now to FIG. 5, an apparatus, generally indicated at 400, for imaging a sound filed inside an acoustic waveguide 402 is illustrated. The apparatus 400 utilizes particle image velocimetry (PIV) measurements. Because the annular device 401 is small, velocity imaging becomes a real challenge. To overcome this challenge, fine seed particles 404 of smoke are injected into the annular device 401 just prior to switching on the heating element 406 to generate sound. The motion of the fine particles 404 in the sound field is viewed by passing a laser sheet 408 generated by a laser 410 through a glass tube section 412 in the waveguide 414, which illuminates the seed particles 404 to be visible by the camera 416. A CMOS camera 416 is directed at the glass tube section 412 to take images of the particles 404 therein. When equilibrium in the acoustic field is established, images can be taken by the camera 416. The images are taken at the same time as two short laser pulses from the laser 410 are generated. The laser pulses are separated by a predetermined, fixed interval, and the particle scattered images are recorded by the camera. These images or measurements are taken on the straight glass section 412 of the annular device 401.

When employing PIV measurement techniques according to the present invention, the sound level output of the device may need to be held at about 140 dB in order to maintain suspension of the seeding particles. Using such techniques, several types of flow patterns may be observed, including Gedeon streaming, start-up noise characterized by instabilities such as vortices, and a traveling wave throughout accompanied by radial standing waves localized near corners of the device. Such measurements are typically very difficult to perform in small high frequency devices utilizing conventional techniques. In order to satisfy Shannon-Nyquist theorem, a 2 kHz engine would need to be sampled at a minimum of 4 kHz. The method of measuring according to the present invention, however, allows for the measurements to be made using a camera with a maximum frame rate per second of 300. This new method makes it possible to perform measurements on a flow without the need for more expensive and delicate high speed equipment, thereby making observation of high speed flows more readily available.

Figure 6:
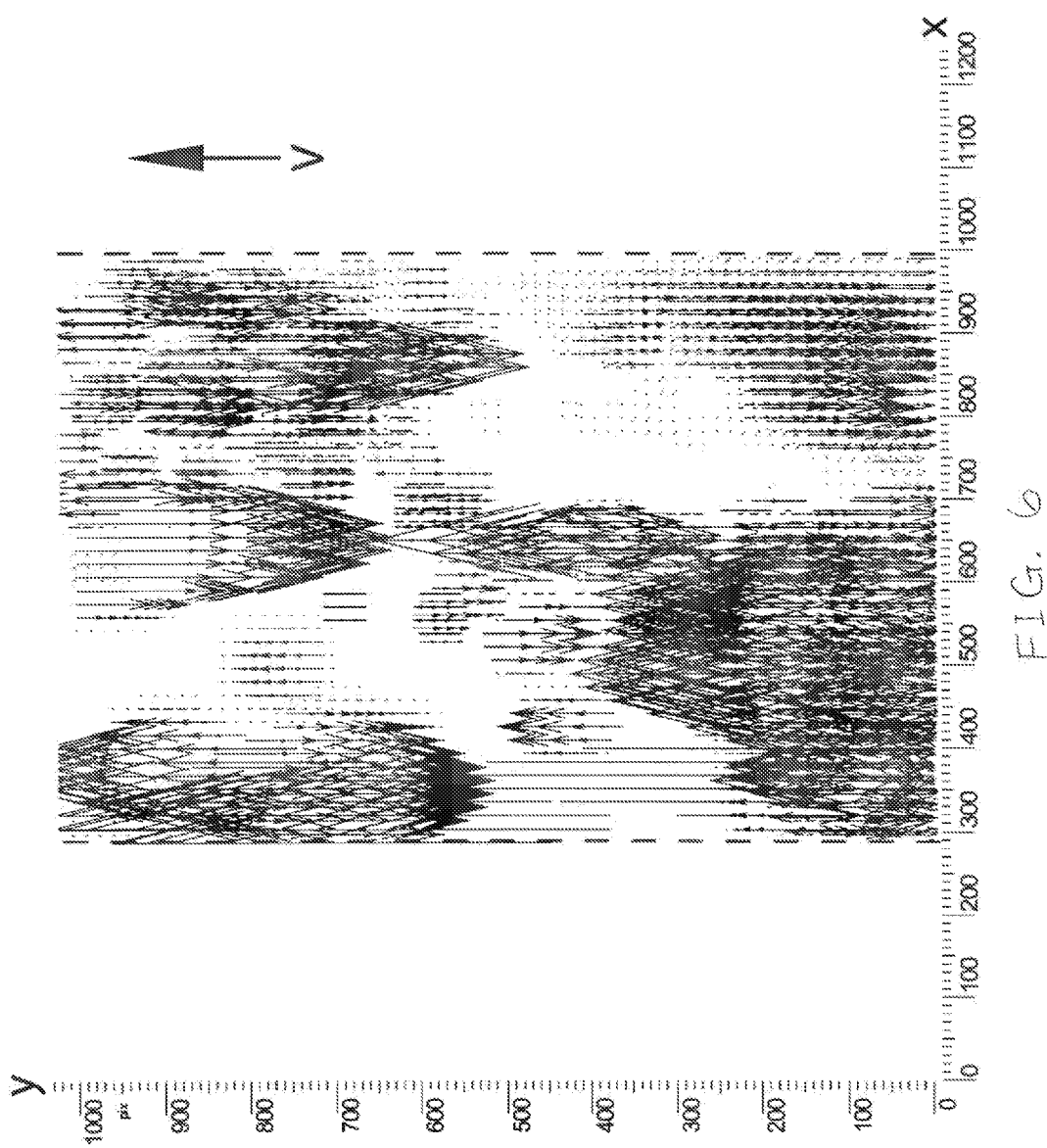
FIG. 6 is a graph illustrating a traveling wave of a thermoacoustic annular device according to the present invention.

As shown in FIG. 6, the flow image of an acoustic traveling wave along the glass waveguide section 412 is illustrated. The image covers an axial distance of approximately 2.5 mm. Based on a calibration of the PIV apparatus 400, particle velocity of the traveling wave is approximately 0.15 m/sec for a 140 dB sound generated by the thermoacoustic annular device when the $\Delta T$ is approximately equal to 94° C.

Because the traveling wave component of the generated sound inside the annular device 401 does not require a phase shift between particle speed and pressure, an increase in the heat to sound efficiency is increased over prior art devices. The efficiency can thus be measured by injecting heat by some means, such as a wire heater attached to the hot heat exchanger, and monitoring the intensity of the generated sound using a piezoresistive pressure probe which sealed inside the waveguide. Heat is generated in the wire heater using a power supply, such as a 9V power supply. Taking into account heat lost to the outside by convection, conduction and radiation, as well as to the interior of the device, the power delivered to the hot side of the device is approximately 3.43 W. This generates a steady-state sound intensity of 156 dB inside the device. The working fluid is air at one atmosphere. An estimate of the efficiency for converting 3.43 W of thermal power to 156 dB of sound intensity which corresponds to acoustic power levels of approximately 0.507 W. This is approximately 59.8% of Carnot. Efficiency is defined as generated sound power divided by direct heat power input to the hot heat exchanger. For a $\Delta T$ of 105° C. and a hot heat exchanger temperature of 425K, the Carnot efficiency of a device according to the present invention is approximately 24.7%. Larger acoustic power values can be achieved by using larger diameter waveguides and regenerators and higher $\Delta T$.

Figure 7:
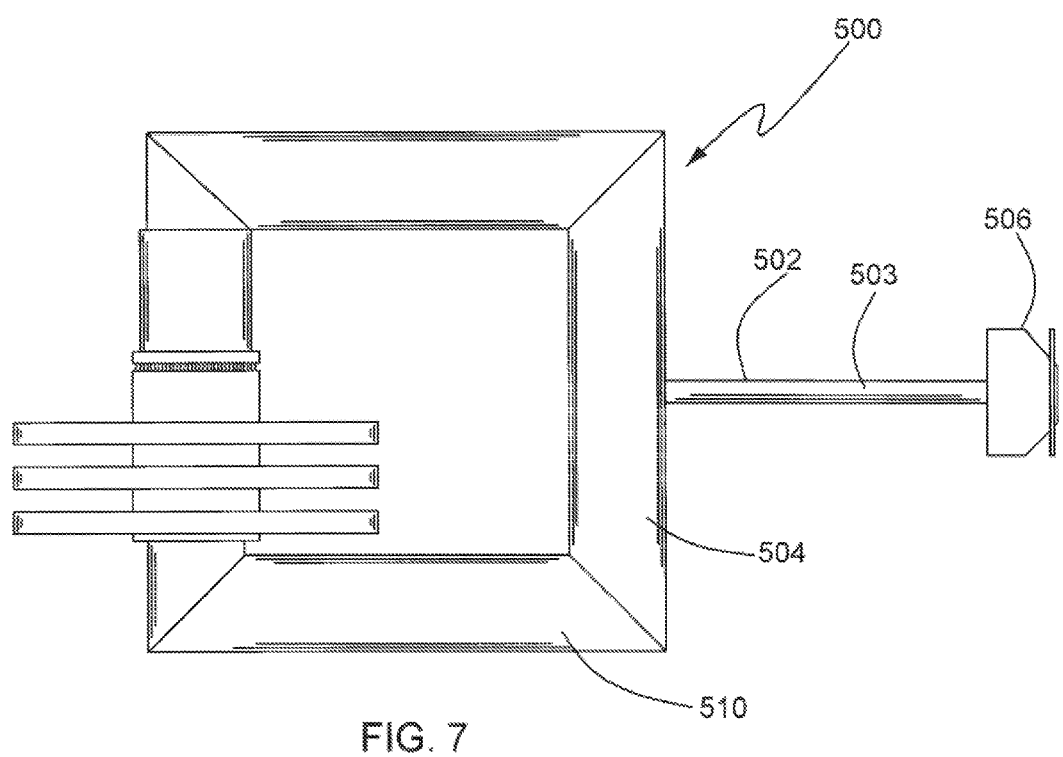
FIG. 7 is a side view of a thermoacoustic annular device coupled to a Power Output Device (POD) for acoustic power extraction and conversion to electricity according to the principles of the present invention.

As illustrated in FIG. 7, in order to use some of the generated sound power for direct conversion to electricity, an annular device, generally indicated at 500 is illustrated. The annular device 500 includes a coupler 502 in the form of a tube 503 coupled to the waveguide wall 504. The opposite end of the tube 503 is coupled to a piezoelectric element 506. Such an arrangement prevents acoustic short circuiting of the annular device 500 by using a relatively small tube 503 to interface the piezoelectric element 506 with the waveguide 510. Impedance matching between the sound field and piezo 506 is provided by using a ¼ wavelength coupler 502. The diameter of the coupler 502 determines the loading effect on the device 500. An overload would lead to effectively switching off of the device 500. For a device having a 1.27 cm diameter waveguide 510, the coupler tube 503 to the piezo 506 may have a diameter of approximately 3.175 mm. A PZT piezo 506 in the monomorph configuration is attached to the coupler 502 for converting the sound to electricity and for monitoring the performance of the device 500. Such an arrangement provides energy conversion from heat to sound to electricity in a single unit.

Figure 8:
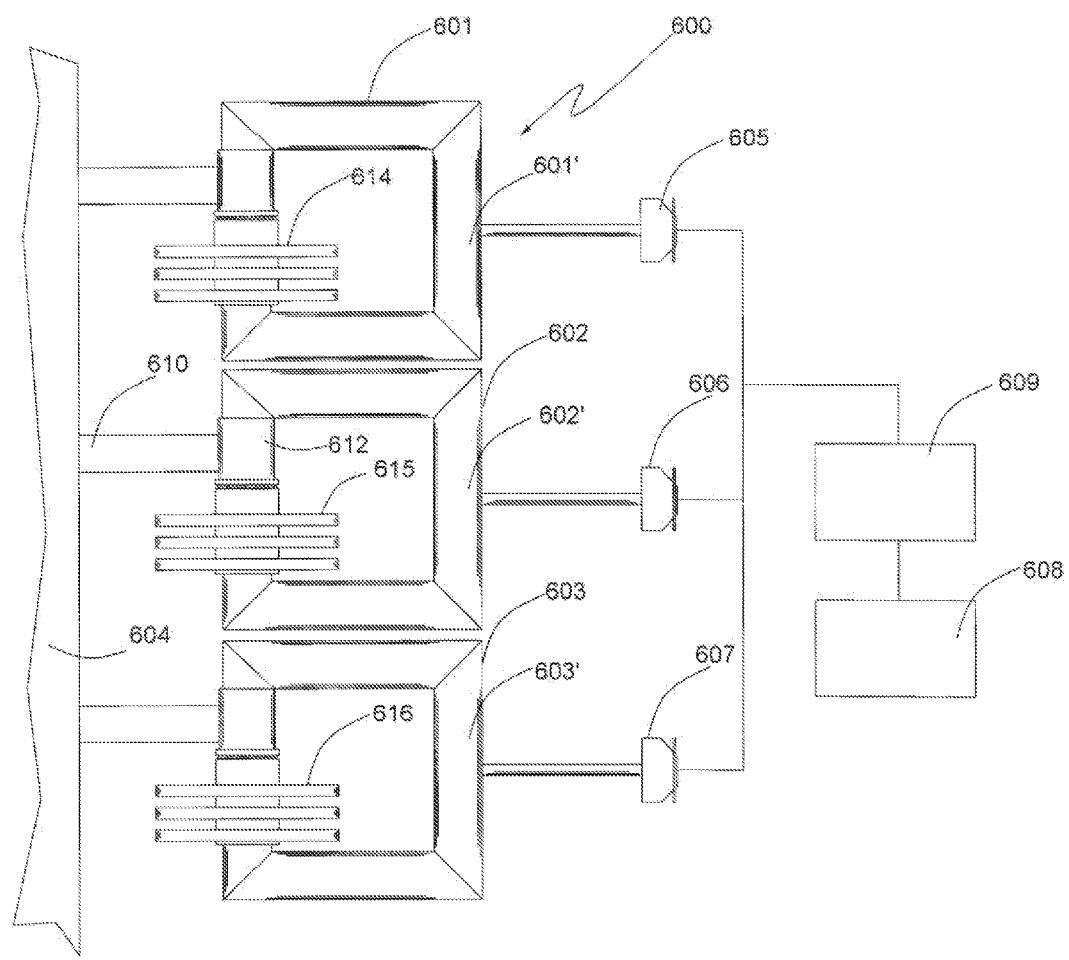
FIG. 8 is a side view of an array of thermoacoustic annular devices coupled to a rectifier for storing electricity in a battery according to the principles of the present invention.

As further illustrated in FIG. 8, it is further contemplated that an array 600 comprised of a plurality of annular thermoacoustic devices 601, 602 and 603 may be provided to convert heat from a heat source 604 to audio or ultrasonic frequency energy, and from the audio or ultrasonic frequency energy to DC electricity by means of an efficient rectifier and stored in a battery 608 or a supercapacitor. Heat sinks 614, 615 and 616 are provided to help maintain the cold side of each resonator

601', 602' and 603' at ambient temperature. In order to convert the electricity generated from each energy converter 605-607 to useful energy, a transformer 609 is electrically coupled to the energy converters 605-607. A diode bridge or bridge rectifier may be provided to convert an alternating current input into a direct current output. The electricity may be stored in a supercapacitor or battery 609 to power a light 608 or some other electrical appliance. The storage of electrical energy in a supercapacitor provides a system with long cycle lives and overall superior performance to energy storage in battery.

Each annular device 601, 602 and 603 is thermally coupled to the heat source 604, as with a thermally conductive coupling device 610 so that heat is by conducted from the heat source to the hot side 612 of the annular device 602. The other annular devices 601 and 603 are similarly attached. When sound is generated inside each resonator 601', 602' and 603', a respective piezoelectric element 605, 606 and 607 generates electricity that can then be stored in the battery 608. A typical array may consist of about 100 devices and may be linked in parallel between a cold plate thermally anchored to ambient temperature and a hot plate where heat is injected.

Figure 9:
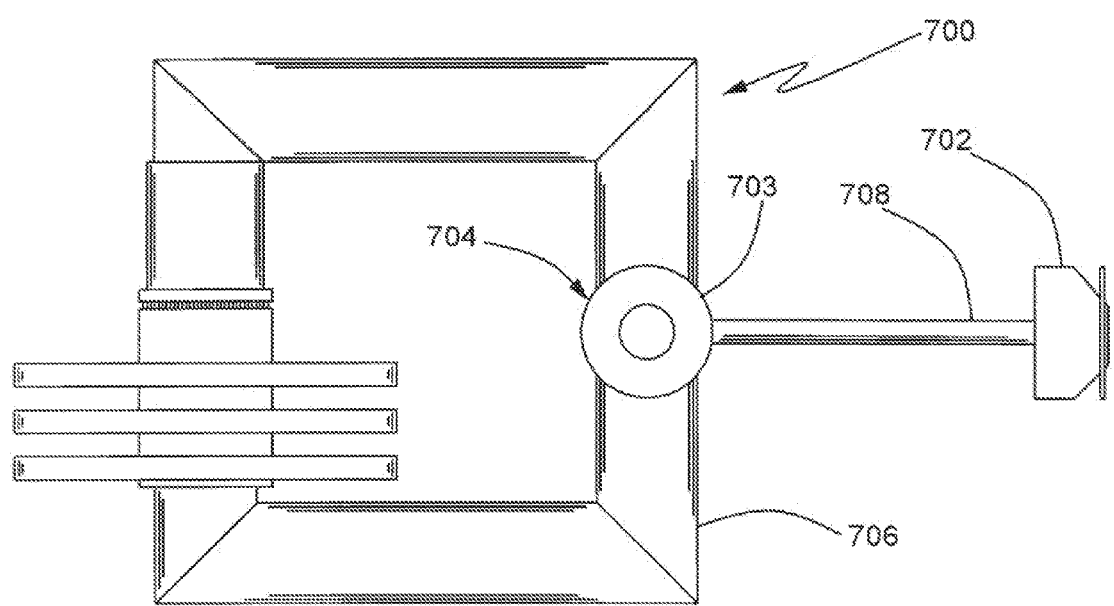
FIG. 9 is a side view of a fourth embodiment of a thermoacoustic annular device modified for Particle Image Velocimetry measurements according to the principles of the present invention with an expanded view of a glass tube portion of the device according to the principles of the present invention.

As further illustrated in FIG. 9, a plurality of energy converters 702, 703 and 704 (energy converter 704 positioned directly behind the energy converter 703), in the form of piezoelectric elements, may be coupled to the annular resonator 706 of the annular device 700. In this way, a single annular resonator 706 can provide sound energy to be converted to electricity by a plurality of piezoelectric elements 702-704. The piezoelectric elements 702-704 are coupled to the resonator 706 via tubes, such as tube 708 and thus radially dispersed around a circumference of one side of the annular resonator 706.

A miniature annular thermoacoustic energy converter according to the principles of the present invention provides a highly efficient device for converting heat to electricity. Operation of the device in the mid-audio frequency range (e.g., between 2 kHz and 4 kHz) demonstrates energy conversion behavior that scales with device size and also shows performance which can be adapted for various kinds of energy conversion applications. Because of the dominant large traveling wave component of the sound generated by the present invention, a high efficiency in heat-to-sound conversion is produced. The resonant frequency corresponds to one wavelength equal to the device's center circumference. Spectrum analysis of the generated sound, shows no standing wave components. The traveling wave mode is apparent as seen from measurements of the acoustic sound pressure along the waveguide using the piezoresistive probe. The pressure amplitude of the sound wave is independent of position along the waveguide circumference, suggesting that there is a traveling wave which leaves the hot heat exchanger and goes around toward the cold heat exchanger. The PIV measurements of the present invention illustrate this as well. The magnitude of the velocity vectors in the PIV imaging is constant over the glass tube length.

In order to further understand the nature of the generated sound wave, tests were performed on effects of the regenerator on the traveling wave. This consisted of measuring the absorption of sound by the regenerator and its reflective properties. For a regenerator 0.5 mm long, with 85% porosity, the absorption of sound at 2.55 kHz was 47.8%. The interface between the regenerator and air did not promote a standing wave mode of the particle velocity inside the waveguide. This is substantiated by the fact that the spectrum of the generated sound does not contain, within experimental error, a frequency component at a fundamental frequency for a standing wave, i.e. a wavelength of 2 L.

Because gas density varies inversely with the temperature, acoustic reflection at the regenerator due to the temperature differences $\Delta T$ along the regenerator, which generates the temperature gradient that drives the oscillator, depends strongly on the magnitude of the temperature difference. In the experiments leading to development of the present invention, the temperature difference $\Delta T$ was relatively small, being of the order of about 130° C. This explains the apparent absence of a reflected wave component and thus no indication of a standing wave. When driven thermoacoustically, the device frequency corresponds to the mode for which the pressure maximum is at the regenerator. Thus, there is an increase in acoustic density oscillations in the hot side of the regenerator, which leads to a reduction of compliance in that region, i.e. a larger impedance of the regenerator. The speed of the gas in the sound field is controlled mainly by the reactive impedance of the regenerator. Since the operating frequency of the device is relatively high, the device performance generates interesting characteristics. For example, an analysis of the phase shift ø around the annular device shows that it has two components, one phase shift along the regenerator and another along the waveguide. Considering the regenerator, the impedance consists of reactive and resistive components.

The compliance in the regenerator is:

$$C = \emptyset V / \gamma P_O$$

Where ø is the air filling factor, V is the air volume, $P_O$ is the ambient pressure and $\gamma$ is the gas constant. The inertance L can be written as:

$$L = \rho l / S$$

where $\rho$ is the air density, l is the length of the regenerator, and S is the cross-sectional area.

The resistive part R of the regenerator is given by:

$$R = 6 \mu l / S d^2_k$$

where $\mu$ is the gas viscosity and $d^2_k$ is the hydraulic radius. Evaluating the above quantities for a 2 kHz device of the present invention, results in the following corresponding impedances of resistance, compliance reactance and inertance, respectively:

$R = 2 \times 10^5$ acoustic ohms
$X_C = 2.28 \times 10^8$ acoustic ohms
$X_L = 3.45 \times 10^4$ acoustic ohms The phase shift along the regenerator is approximately −89.9°, with particle speed leading the acoustic pressure. The phase shift along the rest of the device dominated by distributed acoustic inertance, along the approximately one wavelength waveguide, is +90°. This leads to an overall phase shift of approximately 0 as expected for a pure traveling wave. Moreover the total impedance Z is much higher than the acoustic impedance $\rho c / S$; in fact Z is larger than $\rho c / S$ by approximately a factor of 80. This minimizes effects of dissipation due to high acoustic velocities which is usually a problem for traveling wave devices since losses go as the cube of the speed. Hence by operating at high frequencies, when the reactance is larger than the acoustic impedance of the waveguide, a traveling wave device leads to high efficiency performance. It is important to note that the high frequency annular device presented here works because of the positive feedback imposed by the annular geometry. It is an acoustic oscillator whose gain A can be written as:

$$A = A_O/A_O\beta)$$

where $A_O$ is the gain at the regenerator and $\beta$ is the amount of positive feedback. For an oscillator $A_O\beta \geq$. Referring again to FIG. 4, the initial amplitude of the acoustic oscillations grows until non-linearities in the regenerator decrease the gain $A_O$ and $A_O\beta$ falls to 1 for steady oscillations. The total phase shift for an oscillator is zero as shown above for the thermoacoustic device.

The annular device of the present invention provides a simple and high efficiency thermoacoustic energy converter that can operate at high frequencies. Higher frequency can be accommodated by decreasing the overall size of the device in order to scale it accordingly. Acoustic power gain in the regenerator, together with positive feedback, maintains the oscillations of the oscillator in order to provide simple energy conversion and/or heat to sound.

The energy converter of the present invention is a device which has essentially no moving parts (other than the gas in the resonator and sound chamber and the flexing of the piezoelectric device). The gas may be comprised of air, but may also be helium, gas mixtures or argon and helium, or other gases known in the art. In addition, the working gas may be pressurized for higher power density.

By operating in the mid-audio and low ultrasonic frequency ranges, the thermoacoustic devices are relatively small and can be easily pressurized to high pressure levels. The size of the resonator determines the frequency of the thermoacoustic engine. It does this by setting up a traveling wave resulting from acoustic pulses generated by the temperature gradient across the regenerator. The resonator provides positive feedback at the regenerator which sustains the acoustic oscillations. The only "moving part" in the device of this invention is the working gas which travels around the annular resonator as being driven by the traveling wave.

The heat-to-electricity generating system of the present invention may incorporate various approaches to inject heat to the hot heat exchanger. A flame or a heating element can be used as the source of heat. Heat is injected to the system by direct heating of the hot heat exchanger or by heating the hot section of the resonator to which the hot heat exchanger is thermally anchored. Heat from other sources, such as waste heat from a mechanical or electronic device, can be injected to the hot heat exchanger by metallic thermal conduction, as depicted in FIG. 8. Similarly, an appropriate radioisotope containing element may be used to inject heat to the hot heat exchanger, again by metallic thermal conduction.

The electrical generator may be a piezoelectric element in a monomorph configuration or bimorph configuration. Each piezoelectric element ("piezo") is a capacitor offering high impedance for current extraction. An electrical generator may be tuned to the resonance of the resonator to maximize electric output. Electrical power output may be maximized when the electrical generator is in resonance with the acoustic system device. The electric voltage obtained may be enlarged by configuring the generator in a bimorph mode, where two piezos attached to a metallic membrane are connected in series; such piezos may appear as a bimetallic strip to provide maximum voltage output when exposed to sound power.

While this invention has been described in certain embodiments, the present invention can be further modified with the spirit and scope of this disclosure. This application is therefore intended to cover any variations, uses, or adaptations of the invention using its general principles. Further, this application is intended to cover such departures from the present disclosure as come within known or customary practices in the art to which this invention pertains.

What is claimed is:

1. A thermoacoustic energy converter for converting heat energy to electricity, comprising:
   an annular resonator having a first end and a second end and defining a resonator chamber therein;
   a regenerator disposed between said first and second ends and in fluid communication with said resonator chamber;
   a working fluid disposed within the resonator chamber; and
   an electro-mechanical transducer coupled to the annular resonator and in fluid communication with the working fluid;
   whereby when heat is applied to the first end, a traveling acoustic wave is generated in the annular resonator causing vibrations in the working fluid that actuate the electro-mechanical transducer to generate electricity.

2. The thermoacoustic energy converter of claim 1, further comprising a thermal coupling mechanism coupled proximate to the first end to transfer heat energy from the thermal coupling mechanism to the hot heat exchanger for creating at least one traveling wave within the annular resonator.

3. The thermoacoustic energy converter of claim 1, further comprising an opening in a side of said annular resonator to which the electro-mechanical transducer is coupled, said vibrations in the working fluid passing through the opening to activate the electro-mechanical transducer.

4. The thermoacoustic energy converter of claim 3, further comprising a tube coupled to the opening at one end and to the electro-mechanical transducer at the opposite end, the tube being in fluid communication with the working fluid disposed within the acoustic chamber.

5. The thermoacoustic energy converter of claim 3, wherein said opening is positioned approximately midway between said first end and said second end of said annular resonator.

6. The thermoacoustic energy converter of claim 3, further comprising at least one additional opening in said annular resonator radially spaced from said opening and further comprising at least one additional tube and at least one additional electro-mechanical transducer coupled to the at least one additional opening.

7. The thermoacoustic energy converter of claim 1, wherein said regenerator is comprised of a random fiber regenerator material selected from the group of materials comprised of cotton wool and glass wool.

8. The thermoacoustic energy converter of claim 1, wherein the regenerator has a thickness of approximately 0.5 mm and a filling factor by volume of approximately fifteen percent.

9. The thermoacoustic energy converter of claim 1, wherein the electro-mechanical transducer is comprised of a piezoelectric element that is capable of being actuated by sound at frequencies greater than 2000 Hz, and generating electricity therefrom.

10. The thermoacoustic energy converter of claim 9 wherein said piezoelectric element is capable of being actuated by sound at ultrasonic frequencies, and generating electricity therefrom.

11. The thermoacoustic energy converter of claim 1 further comprising a hot heat exchanger thermally coupled to the first end and a cold heat exchanger thermally coupled to the second end of the annular resonator.

12. The thermoacoustic energy converter of claim 1, wherein said annular resonator has a substantially square, rectangular, circular, round or hexagonal shape.

13. The thermoacoustic energy converter of claim 1, further comprising a plurality of cooling fins thermally coupled to said second end of said annular resonator.

14. The thermoacoustic energy converter of claim 1 wherein the working fluid is selected from the group of gases comprising air, an inert gas, and a mixture of inert gases.

* * * * *